US007771689B2

(12) United States Patent
Sunkara et al.

(10) Patent No.: US 7,771,689 B2
(45) Date of Patent: *Aug. 10, 2010

(54) BULK SYNTHESIS OF METAL AND METAL BASED DIELECTRIC NANOWIRES

(75) Inventors: Mahendra Kumar Sunkara, Louisville, KY (US); Hari Chandrasekaran, Louisville, KY (US); Hongwei Li, Louisville, KY (US)

(73) Assignee: University of Louisville Research Foundation, Inc, Louisville, KY (US)

( * ) Notice: Subject to any disclaimer, the term of this patent is extended or adjusted under 35 U.S.C. 154(b) by 2036 days.

This patent is subject to a terminal disclaimer.

(21) Appl. No.: 10/705,687

(22) Filed: Nov. 10, 2003

(65) Prior Publication Data

US 2004/0132275 A1 Jul. 8, 2004

Related U.S. Application Data

(60) Provisional application No. 60/425,194, filed on Nov. 8, 2002.

(51) Int. Cl.
*C01B 21/06* (2006.01)
(52) U.S. Cl. ....................... 423/409; 438/726
(58) Field of Classification Search ................ 423/409; 502/263, 355, 439; 438/726
See application file for complete search history.

(56) References Cited

U.S. PATENT DOCUMENTS

| | | | |
|---|---|---|---|
| 4,886,683 A | 12/1989 | Hoke et al. | |
| 4,939,308 A | 7/1990 | Maxfield et al. | |
| 5,120,707 A | 6/1992 | Maxfield et al. | |
| 5,334,296 A | 8/1994 | Henkens et al. | |
| 5,381,753 A | 1/1995 | Okajima et al. | |
| 5,725,674 A | 3/1998 | Moustakas et al. | |
| 5,858,862 A | 1/1999 | Westwater et al. | |
| 5,922,183 A | 7/1999 | Rauh | |
| 5,962,863 A | 10/1999 | Russell et al. | |
| 6,033,866 A | 3/2000 | Guo et al. | |
| 6,051,849 A | 4/2000 | Davis et al. | |
| 6,063,246 A | 5/2000 | Wolfe et al. | |
| 6,806,228 B2 * | 10/2004 | Sharma et al. | 502/439 |

FOREIGN PATENT DOCUMENTS

| | | |
|---|---|---|
| JP | 2086121 | 3/1990 |
| JP | 11177134 | 7/1999 |

OTHER PUBLICATIONS

Publication No. WO026422A1 for "High Purity Gallium for Preparation of Compound Semiconductor, and Method and Apparatus for Purifying the Same" by Yamamura et al., published on May 11, 2000.
Publication No. WO9965068A1 for "Fabrication of Gallium Nitride Semiconductor Layers By Lateral Growth From Trench Sidewalls" by Zheleva et al., published on Dec. 16, 1999.
Publication No. WO9944224A1 for "Method of Fabricating Gallium Nitride Semiconductor Layers By Lateral Overgrowth Through Masks, and Gallium Nitride Semiconductor Structures Fabricated Thereby" by Davis et al., published on Sep. 2, 1999.
Y.F. Zhang, Y.H. Tang, N. Wang, C.S. Lee, I. Bello, S.T. Lee "One Dimensional Growth Mechanism of Crystalline Silicon Nanowires," Journal of Crystal Growth 197 (1999) 136-140.
J. Westwater, D.P. Gosain, S. Tomiya, S. Usui, and H. Ruda "Growth of Silicon Nanowires Via Gold/Silane Vapor-Liquid-Solid Reaction," J. Vac. Sci. Technol. B 15(3), May/Jun. 1997, 554-557.
A.M. Morales and C.M. Lieber "A Laser Ablation Method for the Synthesis of Crystalline Semiconductor Nanowires," Science, vol. 279, Jan. 9, 1998, 208-211.
H.F. Yan, Y.J. Xing, Q.L. Hang, D.P. Yu, Y.P. Wang, J. Xu, Z.H. Xi, S.Q. Feng "Growth of Amorphous Silicon Nanowires Via a Solid-Liquid-Solid Mechanism," Chemical Physics Letters 323 (2000) 224-228.
J.L. Gole and J.D. Stout, W.L. Rauch and Z.L. Wang "Direct Synthesis of Silicon Nanowires, Silica Nanospheres, and Wire-Like Nanosphere Agglomerates," Applied Physics Letters, vol. 76, No. 17, Apr. 24, 2000, 2346-2348.

(Continued)

*Primary Examiner*—Edward M Johnson
(74) *Attorney, Agent, or Firm*—Stites & Harbison, PLLC; Terry L. Wright; Mandy Wilson Decker

(57) ABSTRACT

A process of synthesizing metal and metal nitride nanowires, the steps comprising of: forming a catalytic metal (such as gallium, and indium) on a substrate (such as fused silica quartz, pyrolytic boron nitride, alumina, and sapphire), heating the combination in a pressure chamber, adding gaseous reactant and/or solid metal source, applying sufficient microwave energy (or current in hot filament reactor) to activate the metal of interest (such as gold, copper, tungsten, and bismuth) and continuing the process until nanowires of the desired length are formed. The substrate may be fused silica quartz, the catalytic metal a gallium or indium metal, the gaseous reactant is nitrogen and/or hydrogen and the nanowires are tungsten nitride and/or tungsten.

7 Claims, 11 Drawing Sheets

OTHER PUBLICATIONS

J.D. Holmes, K.P. Johnston, R.C. Doty, B.A. Korgel "Control of Thickness and Orientation of Solution-Grown Silicon Nanowires," Science, vol. 287, Feb. 25, 2000, 1471-1473.

P. Scheier, J. Marsen, M. Lonfat, W. Schneider, K. Sattler "Growth of Silicon Nanostructures on Graphite," Surface Science 458 (2000, 113-122).

D.P. Yu, Z.G. Bai, Y. Ding, Q. L. Hang, H.Z. Zhang, J.J. Wang, Y.H. Zou, W. Qian, G.C. Xiong, H.T. Zhou, and S.Q. Feng "Nanoscale Silicon Wires Synthesized Using Simple Physical Evaporation," Applied Physics Letters, vol. 72, No. 26, Jun. 29, 1998, 3458-3460.

Sharma et al. "Novel Vapor-Liquid-Solid Synthesis Method for Carbon Nanostructures," presented on CD and at Carbon2001 Conference at the University of Kentucky, Lexington, KY in Jul. 2001.

Zhang et al. "Morphology and Growth Mechanism Study of Self-Assembled Silicon Nanowires Synthesized by Thermal Evaporation," Chemical Physics Letters 337 (2001) 18-24, Mar. 30, 2001.

Wu et al. "Germanium Nanowire Growth Via Simple Vapor Transport," Chem. Mater. 2000, 12, 605-607.

Y. F. Zhang, Y.H. Tanh, N. Wang, D,P, Yu, C.S. Lee, I. Bello, and S.T. Lee "Silicon Nanowires Prepared by Laser Ablation At High Temperature," Applied physics Letters, vol. 72, No. 15, Apr. 13, 1998, 1835-1837.

D.P. Yu, Y.J. Xing, Q.L. Hang, H.F. Yan, J. Xu, Z.H. Xi, S.Q. Feng "Controlled Growth of Oriented Amorphous Silicon Nanowires Via a Solid-Liquid-Solid (SLS) Mechanism," Physica E 9 (2001) 305-309.

Lieber, "One Dimensional Nanostructures: Chemistry, Physics & Applications,"Solid State Communications, vol. 107, No. 11, 607-616.

C.H. Liang, G.W. Meng, G.Z. Wang, Y.W. Wang, L.D. Zhang, and S.Y. Zhang, "Catalytic Synthesis and Photoluminescence of $Ga_2O_3$ Nanowires" Appl. Phys. Lett. 78, 3202 (2001).

Y.C. Choi, W.S. Kim, Y.S. Park, S.M. Lee, D.J. Bae, Y.H. Lee, G-S Park, W.B. Choi, N.S. Lee and J.M. Kim, "Catalytic Growth of $Ga_2O_3$ Nanowires by ARC Discharge" Adv. Mater. 12, 746 (2000).

W.Q. Han, P. Kohler-Redlich, F. Ernest, and M. Ruhle, "Growth and Microstructure of $Ga_2O_3$ Nanorods" Solid State Commun. 115, 527 (2000).

J.Q. Hu, X.L. Ma, N.G. Shang, Z.Y. Xie, N.B. Wong, C.S. Lee, and S.T. Lee, "Large-Scale Rapid Oxidation Synthesis of $SnO_2$ Nanoribbons" J. Phys. Chem. B 106, 3823 (2002).

X.S. Peng, Y.W. Wang, J. Zhang, X.F. Wang, L.X. Zhao, G.W. Meng, and L.D. Zhang, "Large Scale Synthesis of $In_2O_3$ Nanowires" Appl. Phys. A 74, 437 (2002).

G. Gundiah, A. Govindaraj, and C.N.R. Rao, "Nanowires, Nanobelts and Related Nanostructures of $Ga_2O_3$" Chem. Phys. Lett. 351, 189 (2002).

S. Sharma and M.K. Sunkara, "Direct Synthesis of Gallium Oxide Tubes, Nanowires, and Nanopaintbrushes" The Journal of the American Chemical Society, 124, 12288-12293, (In Press, 2002).

Z.R. Dai, Z.W. Pan, and Z.L. Wang, "Gallium Oxide Nanoribbons and Nanosheets" J. Phys. Chem. B 106, 902-904 (2002).

M.H. Huang, Y. Wu, H. Feick, N. Tran, E. Weber, and P. Yang, "Catalytic Growth of Zinc Oxide Nanowires by Vapor Transport" Adv. Mater. 13, 113 (2001).

\* cited by examiner

1. Slug tuner
2. Baratron pressure gauge
3. View port
4. Stainless cold wall chamber
5. Alumina coated resistive heater
6. Copper connection
7. Step-down transformer
8. Mass flow controller
9. Pressure control valve
10. Variable transformer
11. ECR Plasma Source
12. Ring bellow valve
13. Gate Valve
14. Formaline oil mechanical pump
15. Turbo molecular pump
16. Coaxial cable

BULK SYNTHESIS OF METAL AND METAL BASED DIELECTRIC NANOWIRES

RELATED APPLICATIONS

This application claims priority from Provisional Application Ser. No. 60/425,194 filed on Nov. 8, 2002 all of which is incorporated by reference herein.

This application is part of a government project. The research leading to this invention was Supported by a Grant Number F49620-00-1-0310 from Air Force Office of Scientific Research. The United Government retains certain rights in this invention.

FIELD OF THE INVENTION

This invention relates to the field of a method of synthesizing free-standing metallic nanowires and dielectric metal nitride nanowires without the use of soft or hard templates.

BACKGROUND OF THE INVENTION

Nano-porous templates of alumina are commonly used to grow metallic nanowires. The diameters of the nanowires are controlled only by the size of the pore.

There exists four methods for the growth of GaN nanowires. (1) Confined growth of metal nanowires using carbon nanotubes or nanoporous alumina membranes. In the carbon nanotubes the growth of metal is restricted to the diameter of the tubes. In nanoporous alumina it has been suggested that the capillary effect of these anodic pores are responsible for the formation of metal nanowires. (2) Atomic force lithography. (3) Electro deposition. (4) Solid phase arc discharge method.

Currently there exists no method to grow freestanding metallic nanowires.

SUMMARY OF THE INVENTION

Nanometer scale semiconductor one-dimensional structures such as nanowires are expected to be very important in future high power electronics and opto-electronic device applications. These structures would need metallic interconnects so as to miniaturize the system. Hence it is necessary to develop technology to produce metallic nanowires that can be form hetero-structures directly on the nano-components. It is equally important to be able to form dielectric hetero junctions on semiconductor nanowires to enhance the performance of the device. Furthermore, these metallic nanowires also exhibit photoluminescence in the red-near infrared (IR), region, which also makes it attractive for use as a sensors.

The present invention provides a novel synthesis technique, the first of their kind in terms of producing long, freestanding metal nanowires and whiskers without the use of hard or soft templates. The instant invention provides a means for varying the concentration of the metallic solute in the gallium or other low melting metal to modulate the diameter of the nanowires along its length.

More particularly, the present invention provides for a process of synthesizing metal, metal nitride nanowires, and non-stotiometric metal nitride nanowires, the steps comprising of: forming a catalytic metal (such as gallium, and indium) on a substrate (such as fused silica quartz, pyrolytic boron nitride, alumina, and sapphire), heating the combination in a pressure chamber, adding gaseous reactant and/or solid metal source; applying sufficient microwave energy (or current in hot filament reactor) to activate the metal of interest (such as gold, copper, tungsten, and bismuth) and continuing the process until nanowires of the desired length are formed. The substrate may be fused silica quartz, the catalytic metal a gallium or indium metal, the gaseous reactant is nitrogen and/or hydrogen and the nanowires are tungsten nitride and/or tungsten.

Furthermore, the present invention provides for a process of synthesizing metal and metal nitride nanowires, comprising the steps of forming a catalytic metal on a substrate; heating the catalytic metal on the substrate in a pressure chamber; adding gaseous nitrogen and/or hydrogen reactant and/or solid metal source; applying sufficient microwave energy (or current in hot filament reactor) to activate the gaseous metal reactant and/or solid metal source; and forming nanowires of a selected metal or metal nitride of a desired length.

The process of synthesizing metal and/or metal nitride nanowires, comprises the steps of forming a gallium layer of about 100 microns on a fused silica quartz substrate; placing the combination in a pressure chamber; reducing the pressure in the chamber to 50 Torr; heating the substrate and gallium to 700-1000 degrees C.; heating the tungsten filament to 700-1000 degrees C.; adding nitrogen gas; applying sufficient microwave power to sputter tungsten into gas phase; and continuing the process until the nanowires is of the desired length.

It is an object of the present invention to provide a process which eliminates the need for quantum sized droplet creation, as is required when transition metals such as gold are used for nanowire synthesis. In principle, the bulk nanowire synthesis technique of the instant invention should work for any material that is immiscible in the gallium solvent. Specifically metal and non-stotiometric metal nitrides (M and MxNy), where M indicates metals such as gold, copper, tungsten, and bismuth.

It is also an object of the present invention to provide a bulk nanowire synthesis technique which works metals such as gold, copper, tungsten, and bismuth and their respective nitrides.

It is another object of the present invention to provide a technique to grow freestanding metallic nanowires, which is advantageous in subsequent device fabrication.

It is another object of the present invention to provide a technique to change the saturation concentration in order for the nanowire diameter to be modulated, which is not achievable using current template based techniques.

It is another object of the present invention to provide a bulk nanowire synthesis technique forming products having a density of nucleation that is extremely high making it suitable for large scale bulk synthesis.

It is another object of the present invention to utilize a method using vapor phase precursors, in order to visualize synthesis of metal-semiconductor interfaces and avoid the laborious and time-consuming process of forming contacts to nanoscale devices made of semiconductors.

BRIEF DESCRIPTION OF THE DRAWINGS

A better understanding of the present invention will be had upon reference to the following description in conjunction with the accompanying drawings in which like numerals refer to like parts throughout the several views and wherein.

DETAILED DESCRIPTION OF THE INVENTION

Figure 1:
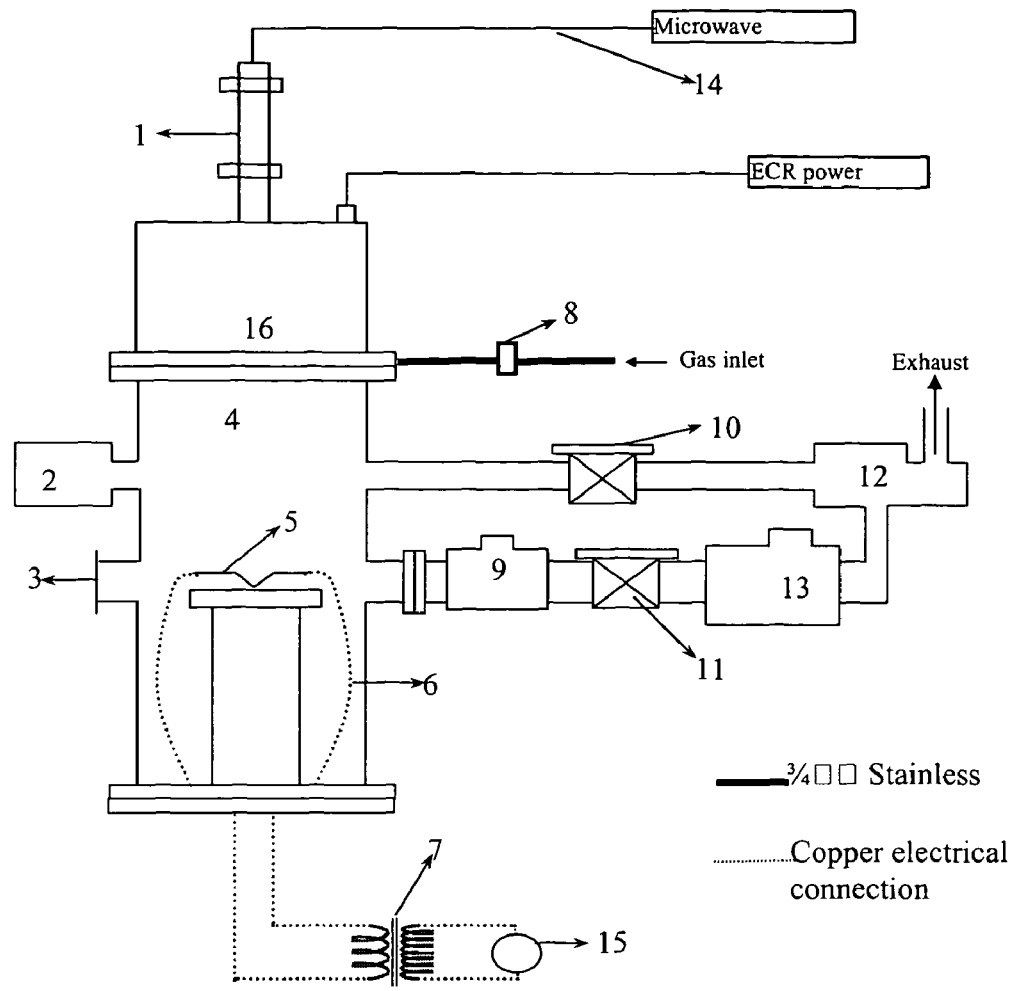
FIG. 1 is a schematic of an ECR-MW plasma reactor.
Figure 2:
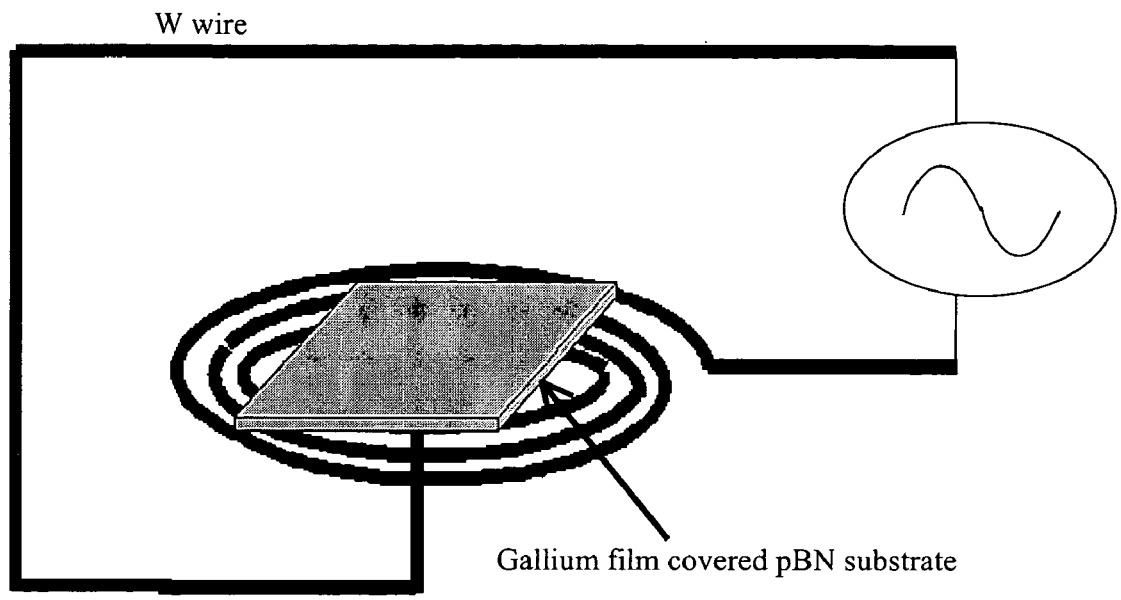
FIG. 2 is a schematic diagram of the arrangement for the growth of tungsten nanowires.
Figure 3:
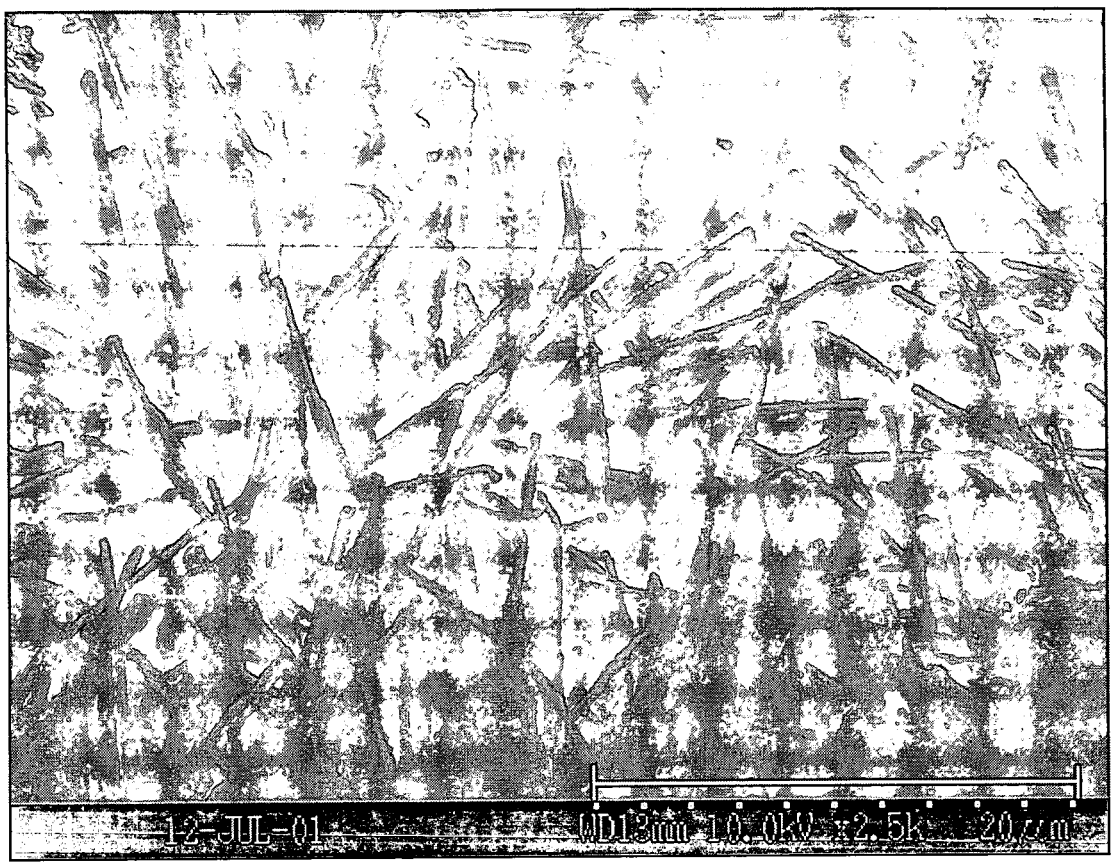
FIG. 3 is a scanning electron micrograph showing micrographs of tungsten nanowires.
Figure 4:
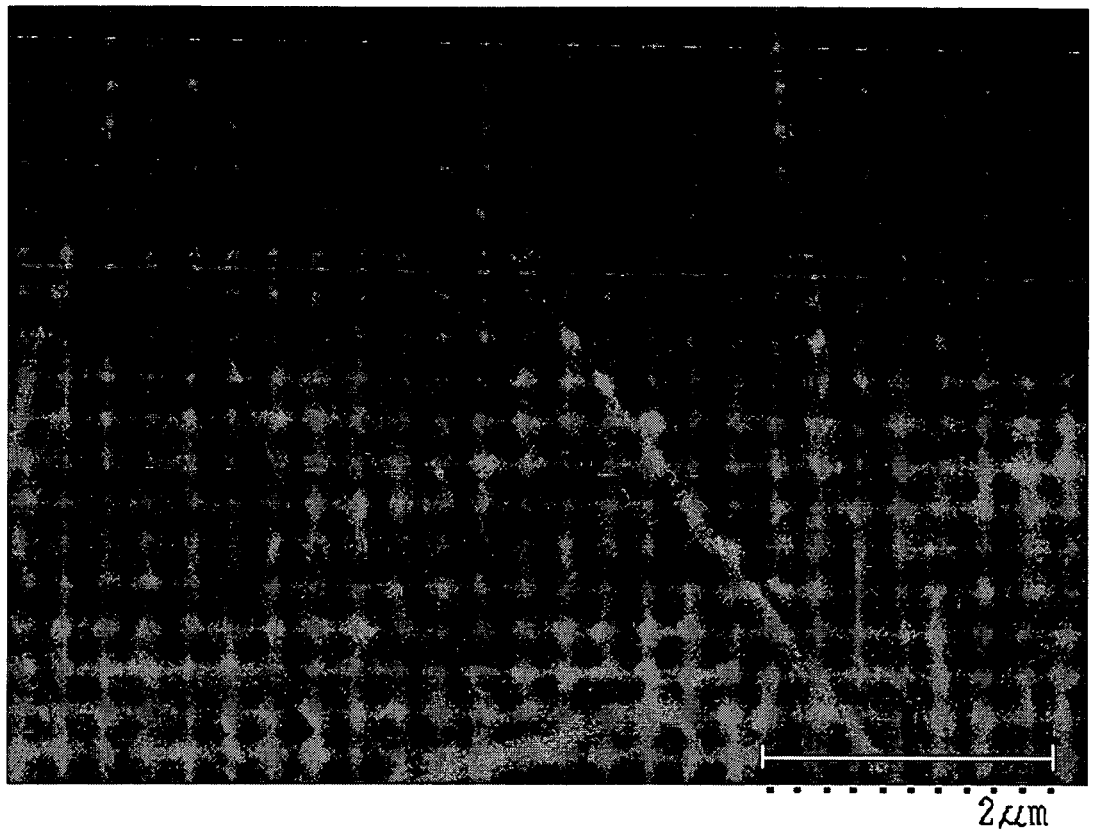
FIG. 4 is a scanning electron micrograph showing individual strands of tungsten nanowires bunched together.
Figure 5:
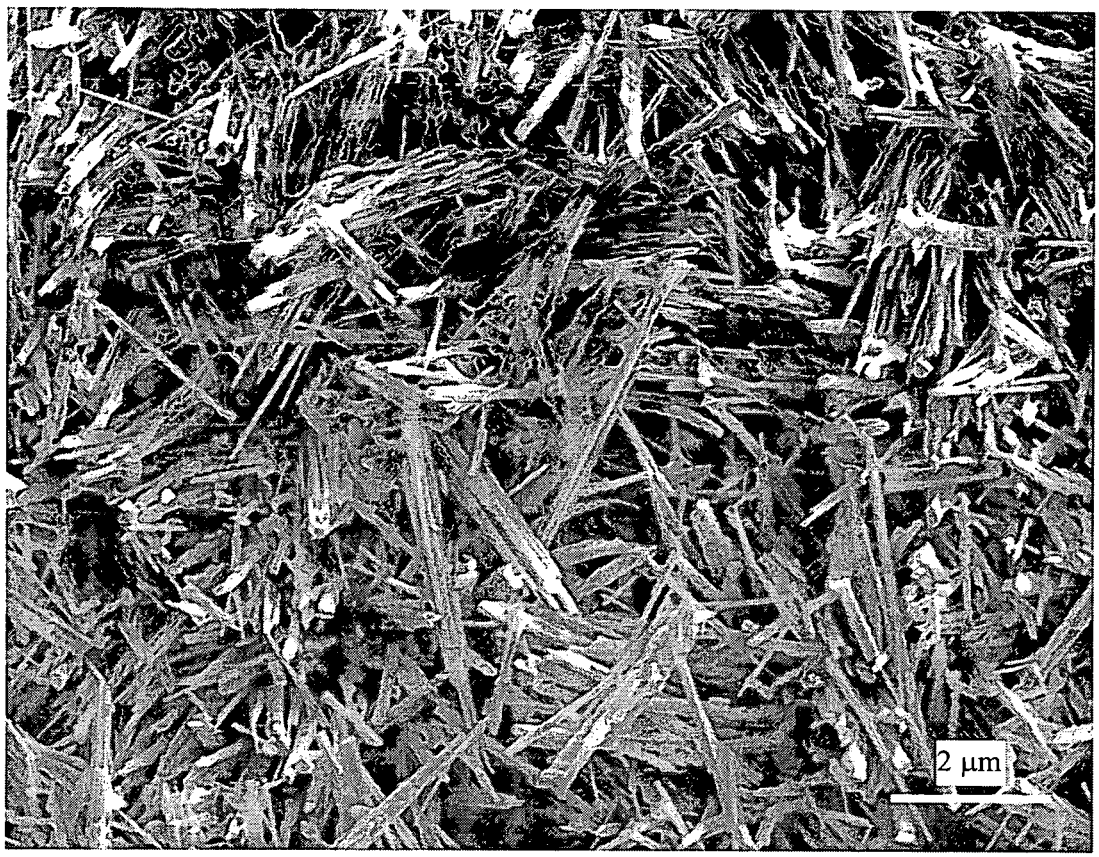
FIG. 5 is a scanning electron micrograph showing a cluster of tungsten nanowires bunched together.
Figure 6:
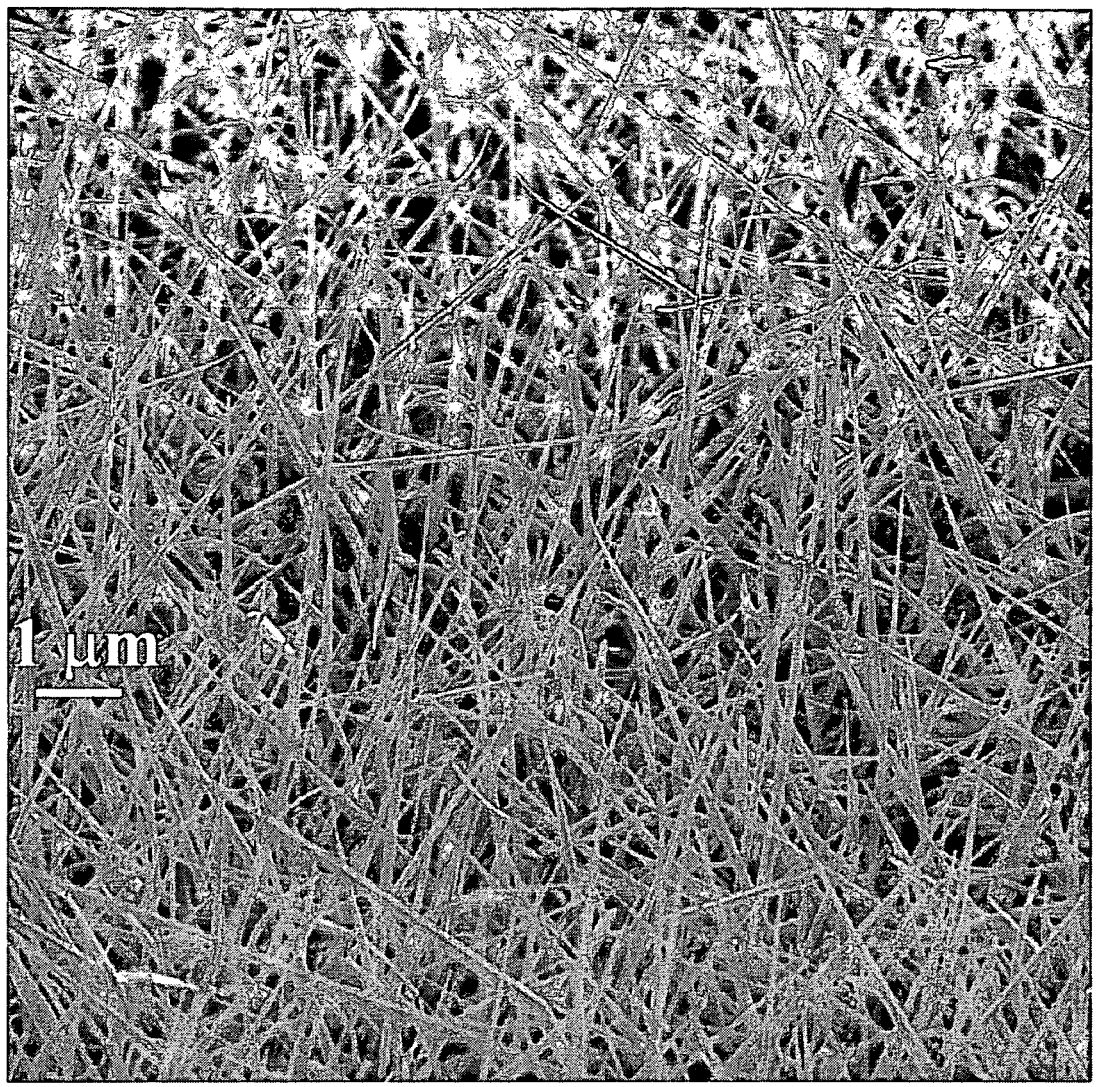
FIG. 6 is a scanning electron micrograph showing a long straight clusters or oriented nanowires.
Figure 7:
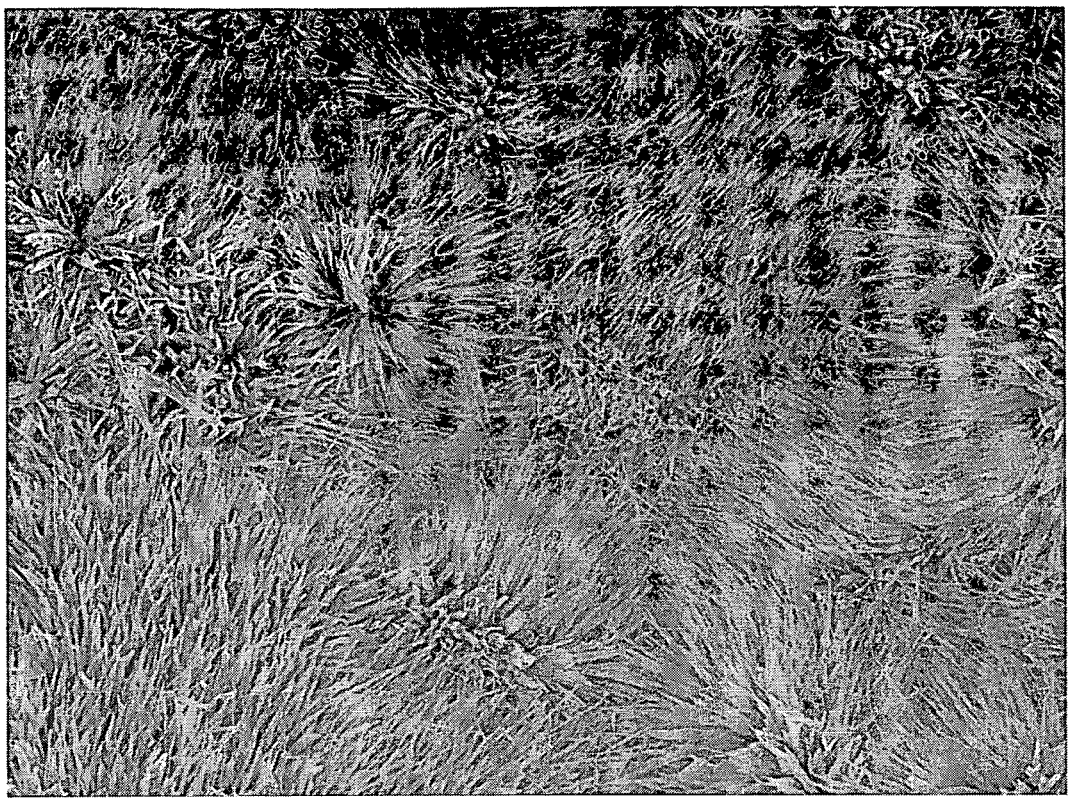
FIG. 7 is a scanning electron micrograph showing florets of metallic nanowires.
Figure 8:
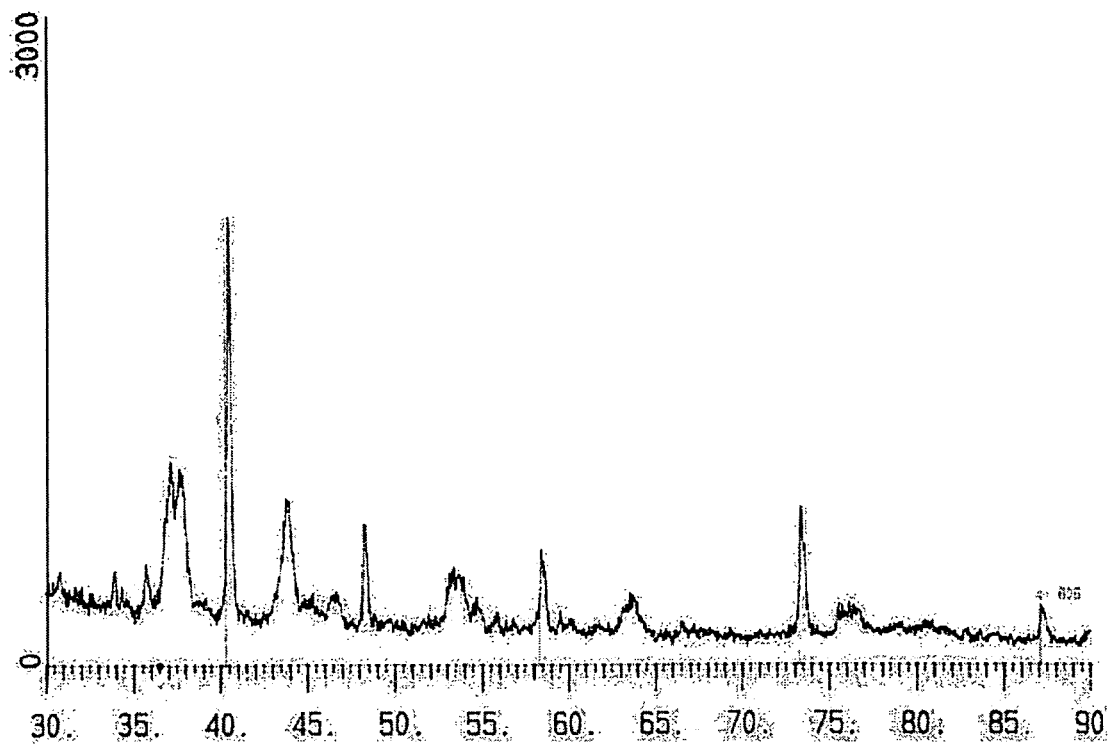
FIG. 8 is an X-ray diffraction of the nanowires indicating the presence of tungsten and tungsten nitride phases.
Figure 9:
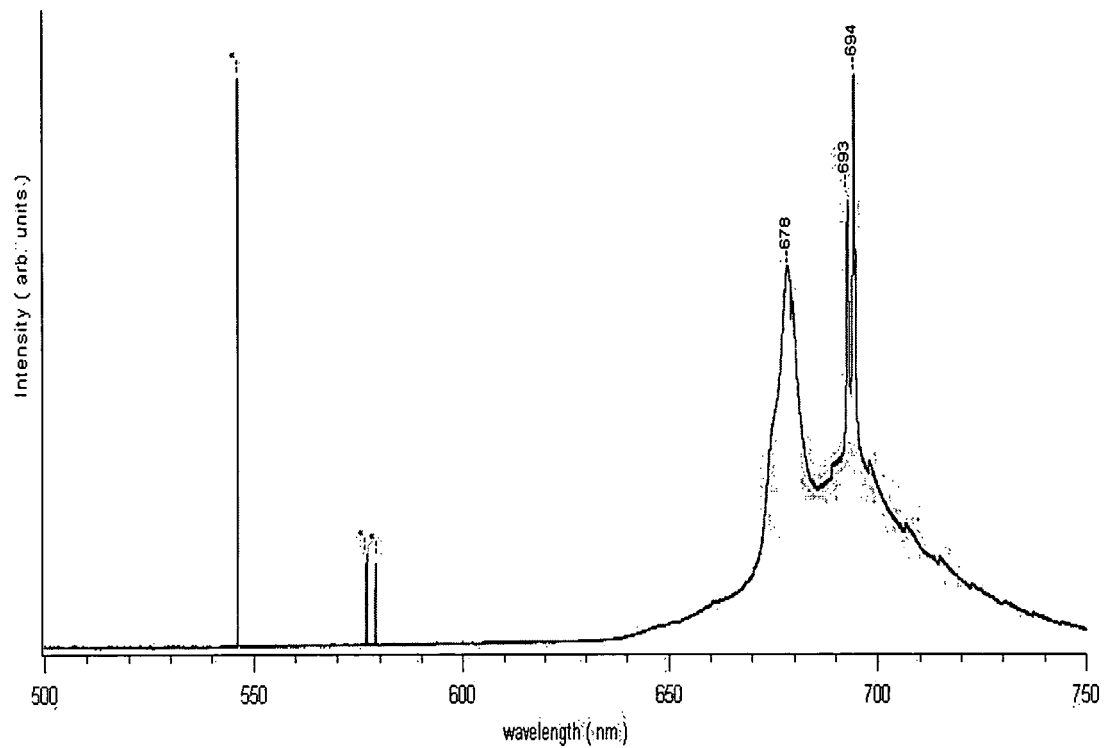
FIG. 9 is a photoluminescence spectrum obtained with tungsten nanowire sample.
Figure 10:
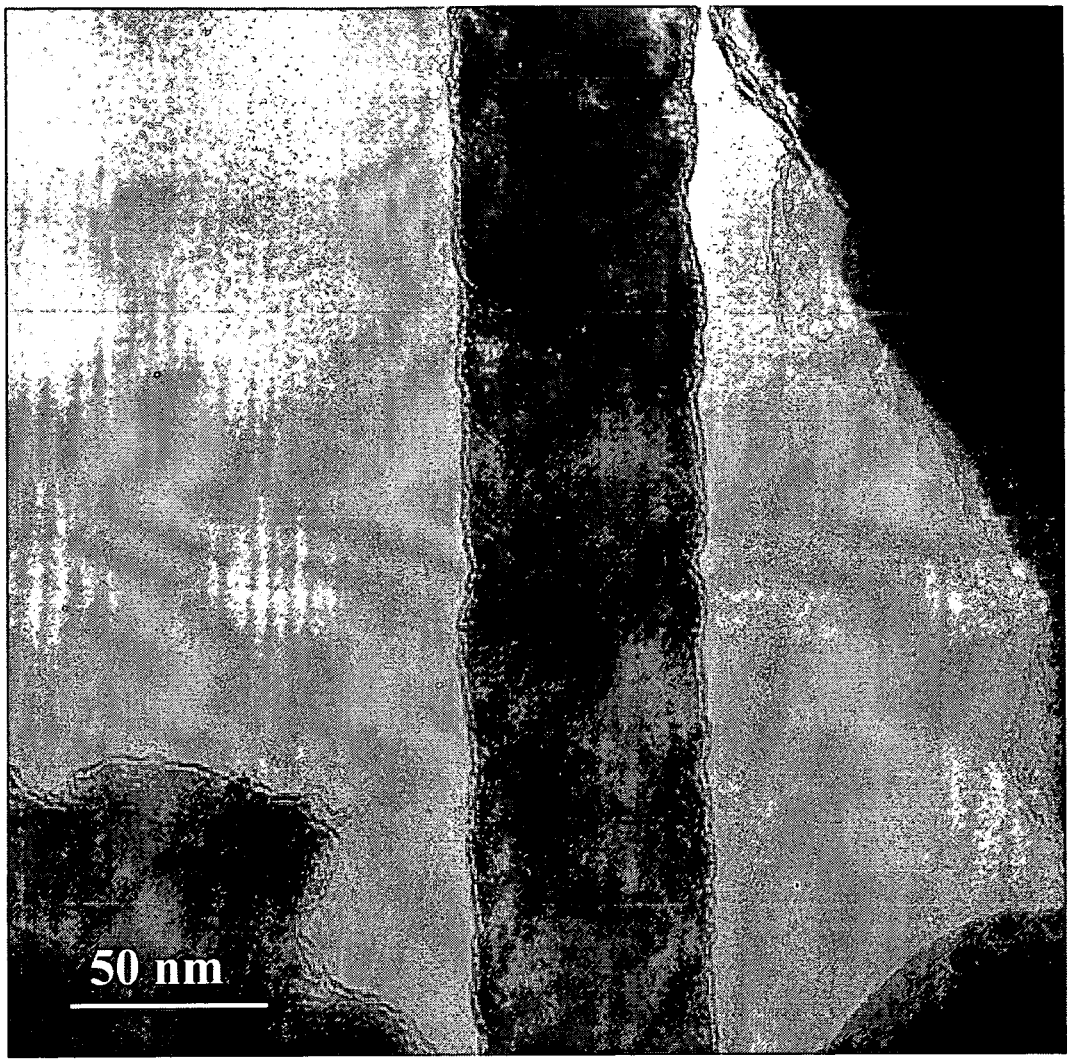
FIG. 10 is a low magnification, bright field image of tungsten nanowire using a transmission electron microscope.
Figure 11:
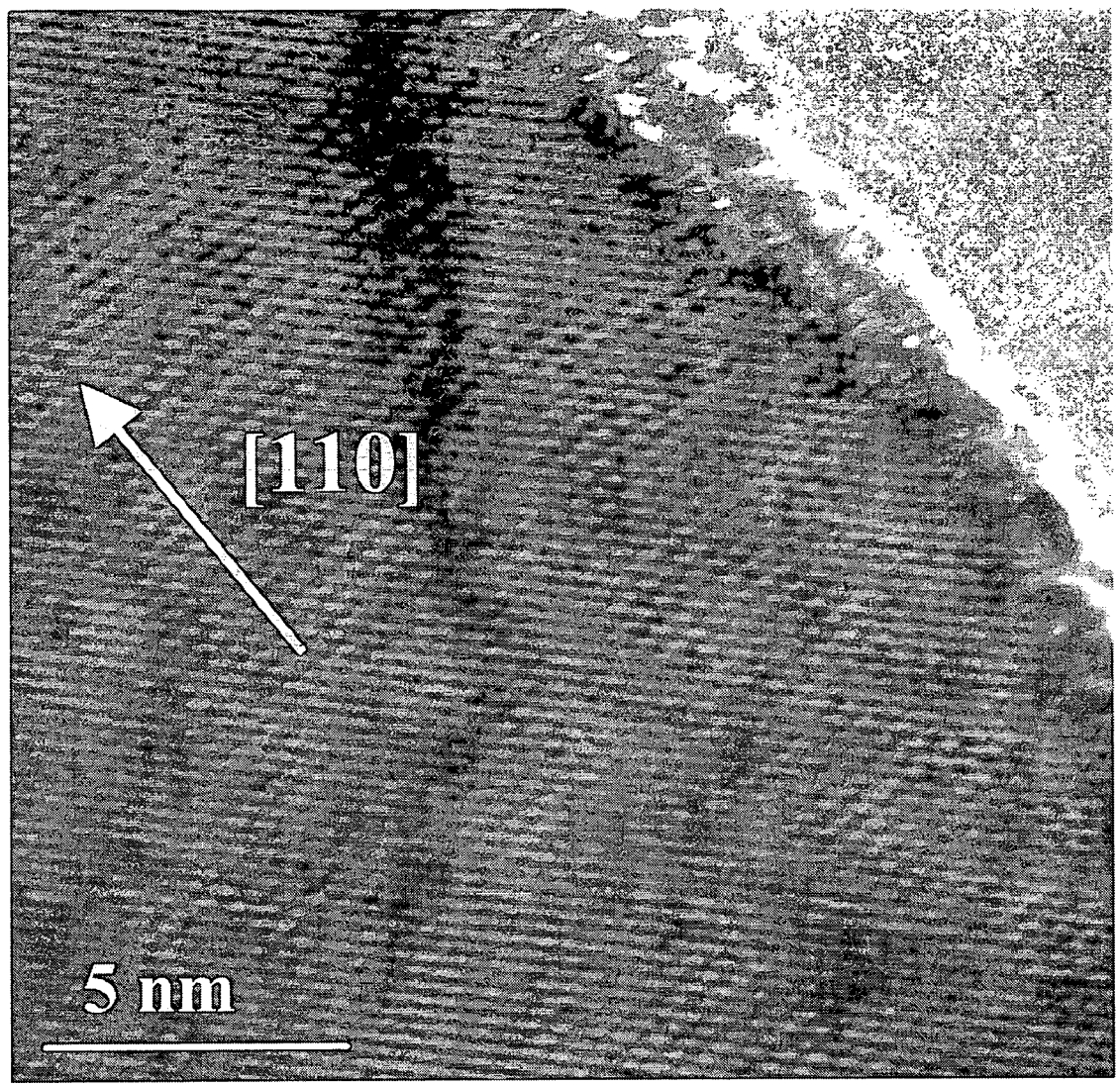
FIG. 11 is a high resolution transmission electron micrograph of tungsten nanowire showing crystalline lattice structure with around 0.3 nm spacings.

The present invention relates to a method of synthesizing free-standing metallic nanowires and dielectric metal nitride nanowires. There is currently no technique available that synthesizes free-standing metal nanowires without the use of soft or hard templates. The present invention provides a new method of bulk synthesis of low melting metals using for example, tungsten and tungsten nitride nanowires. In this technique, tungsten is supplied via chemical vapor transport from an organometallic vapor source onto gallium-covered substrates at 700-1000 degrees C. at 30 mTorr-30 Torr pressure range in nitrogen plasma using a microwave electron cyclotron resonance plasma reactor as shown in the schematic in FIG. 1, or course a hot-filament reactor could also be used as an activation source. This method also produces tungsten nitride, (WN), wires which could be treated with hydrogen plasma to reduce them to pure metallic state while retaining the nanowire format. The process can also be performed with oxygen in the gas phase to produce metal oxide wires and then reducing them with hydrogen to get pure metallic nanowires. Both of these approaches are applicable to the present invention by 1) First producing metal nitride nanowires in a nitrogen environment and then reducing them to pure metallic nanowires; or 2) First producing oxide nanowires in an oxygen environment and then reducing them in hydrogen environment or decomposition temperature to pure metallic nanowires) are important processes of this invention in addition to direct synthesis of pure metallic nanowire synthesis.

The bulk nanowire synthesis (BNS) technique of the present invention is used to synthesize free standing metallic nanowires can be generalized into three basic steps: (1) the material used to make the nanowire is dissolved in a low melting point metal solvent, using a plasma (or high temperature) to mediate solute dissolution from the vapor phase into the molten metal; (2) the solute concentration is increased until the solvent becomes supersaturated; and (3) crystallization occurs, and nanowires precipitate from the solvent. For a number of reasons, gallium is an ideal choice for a low melting point solvent that allows for the formation of nanometer scale wires from a variety of different materials. Gallium has a low vapor pressure over a broad temperature range and a near room temperature melting point (29.8 degree C.). In addition, it is immiscible with many elemental semiconductor and metals. Because of the low miscibility, the critical nucleus size for solute precipitation from Ga melts tends to be in the nanometer range. Multiple nanowires of fixed diameter nucleate from the molten gallium, as long as the nanowire material is supplied rapidly at the gallium liquid-vapor interface.

The instant invention provides a process which eliminates the need for quantum sized droplet creation, as is required when transition metals such as gold are used as catalysts for nanowire synthesis. It is contemplated that the BNS technique should work for any material that is immiscible in the gallium solvent.

The novel synthesis technique of the instant invention was employed to produce long, freestanding metal nanowires and whiskers without the use of templates as set forth in Example I as follows:

EXAMPLE I

A flat piece of pyrolytic boron nitride PBN was cleaned with a 45% HF solution and ultra-sonicated acetone before being covered with thin liquid gallium film. This gallium film was resistively heated along with a tungsten wire to a temperature of 900 degrees C. and exposed to an electron cyclotron resonance microwave (ECR-MW) chemical vapor deposition generated nitrogen plasma environment. Nitrogen sputters the tungsten particles onto the gallium film, which subsequently dissolves in liquid gallium. The tungsten (solute) concentration is increased until the gallium (solvent) becomes supersaturated after which, crystallization occurs, and nanowires precipitate from the solvent. It should be noted that the solvent (gallium) metal melt used for the process can be substituted with indium, tin and other low melting metal which serve as catalytic metals.

As shown in the example, it is an advantage of the instance process is the ability to utilize a template free bulk synthesis technique without the requirement of an extensive substrate preparation.

Moreover, varying the concentration of the metallic solute in the gallium or other low melting metal can modulate the diameter of the nanowires along its length.

The foregoing detailed description is given primarily for clearness of understanding and no unnecessary limitations are to be understood therefrom, for modification will become obvious to those skilled in the art upon reading this disclosure and may be made upon departing from the spirit of the invention and scope of the appended claims. Accordingly, this invention is not intended to be limited by the specific exemplifications presented herein above. Rather, what is intended to be covered is within the spirit and scope of the appended claims.

We claim:

1. A process of synthesizing metal and metal nitride nanowires, comprising the steps of:
    forming a catalytic metal on a substrate;
    heating said catalytic metal on said substrate in a pressure chamber
    adding gaseous nitrogen and/or hydrogen reactant and/or solid metal source;
    applying sufficient microwave energy (or current in hot filament reactor) to activate said gaseous metal reactant and/or solid metal source; and
    forming nanowires of a selected metal or metal nitride of a desired length.

2. The process of synthesizing metal and metal nitride nanowires of claim 1, wherein said catalytic metal comprises gallium or indium.

3. The process of synthesizing metal and metal nitride nanowires of claim 1, wherein said substrate comprises fused silica quartz, pyrolytic boron nitride, alumina, and sapphire.

4. The process of synthesizing metal and metal nitride nanowires of claim 1, wherein said metal of interest comprises gold, copper, tungsten, bismuth, and combinations thereof.

5. A process of synthesizing metal and metal nitride nanowires, comprising the steps of:
    forming a gallium metal on a fused silica quartz substrate;
    heating said catalytic metal on said substrate in a pressure chamber
    adding gaseous nitrogen and/or hydrogen reactant to a solid metal tungsten nitride and/or tungsten source;
    applying sufficient microwave energy (or current in hot filament reactor) to activate said gaseous nitrogen and/or hydrogen reactant to said tungsten nitride and/or tungsten source; and
    forming nanowires of tungsten or tungsten nitride of a desired length.

6. A process of synthesizing metal and metal nitride nanowires, comprising the steps of:
    forming a indium metal on a fused silica quartz substrate;
    heating said catalytic metal on said substrate in a pressure chamber
    adding gaseous nitrogen and/or hydrogen reactant to a solid metal tungsten nitride and/or tungsten source;
    applying sufficient microwave energy (or current in hot filament reactor) to activate said gaseous nitrogen and/or hydrogen reactant to said tungsten nitride and/or tungsten source; and
    forming nanowires of tungsten or tungsten nitride of a desired length.

7. A process of synthesizing metal and metal nitride nanowires, comprising the steps of:
    forming a gallium layer of about 100 microns on a fused silica quartz substrate;
    placing the combination in a pressure chamber;
    reducing the pressure in the chamber to 50 Torr;
    heating the substrate and gallium to 700-1000 degrees C.;
    heating the tungsten filament to 700-1000 degrees C.;
    adding nitrogen gas;
    applying sufficient microwave power to sputter tungsten into gas phase and continuing the process until the nanowires is of the desired length.

* * * * *